(12) United States Patent
Coronel et al.

(10) Patent No.: US 6,969,878 B2
(45) Date of Patent: Nov. 29, 2005

(54) SURROUND-GATE SEMICONDUCTOR DEVICE ENCAPSULATED IN AN INSULATING MEDIUM

(75) Inventors: Philippe Coronel, Barraux (FR); Stephane Monfray, Grenoble (FR); Thomas Skotnicki, Crolles Montfort (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/409,653

(22) Filed: Apr. 8, 2003

(65) Prior Publication Data
US 2004/0016968 A1    Jan. 29, 2004

(30) Foreign Application Priority Data
Apr. 8, 2002    (FR) .................................. 02 04358

(51) Int. Cl.[7] ............................................. H01L 21/84
(52) U.S. Cl. ........................................ 257/247; 257/63
(58) Field of Search ........................... 257/63, 65, 347, 257/349, 351, 352, 365, 401

(56) References Cited

U.S. PATENT DOCUMENTS

| | | | | |
|---|---|---|---|---|
| 5,348,899 A | * | 9/1994 | Dennison et al. | 438/157 |
| 5,482,877 A | * | 1/1996 | Rhee | 438/157 |
| 5,497,019 A | * | 3/1996 | Mayer et al. | 257/347 |
| 5,583,362 A | | 12/1996 | Maegawa | |
| 5,705,405 A | * | 1/1998 | Cunningham | 438/157 |

FOREIGN PATENT DOCUMENTS

| | | |
|---|---|---|
| EP | 0 612 103 A2 | 8/1994 |
| FR | 2 791 178 | 9/2000 |
| FR | 2 795 555 | 12/2000 |
| FR | 2 799 305 | 4/2001 |

OTHER PUBLICATIONS

Preliminary Search Report for French Patent Application No. 02 04358 dated Mar. 13, 2003.

* cited by examiner

Primary Examiner—Minhloan Tran
Assistant Examiner—Thomas L. Dickey
(74) Attorney, Agent, or Firm—Lisa K. Jorgenson; Stephen Bongini; Fleit, Kain, Gibbons, Gutman, Bongini & Bianco P.L.

(57) ABSTRACT

A semiconductor device is provided that includes a semiconductor channel region extending above a semiconductor substrate in a longitudinal direction between a semiconductor source region and a semiconductor drain region, and a gate region extending in the transverse direction, coating the channel region, and insulated from the channel region. The source, channel, and drain regions are formed in a continuous semiconductor layer that is approximately plane and parallel to the upper surface of the substrate. Additionally, the source, drain, and gate regions are coated in an insulating coating so as to provide electrical insulation between the gate region and the source and drain regions, and between the substrate and the source, drain, gate, and channel regions. Also provided is an integrated circuit that includes such a semiconductor device, and a method for manufacturing such a semiconductor device.

5 Claims, 10 Drawing Sheets

SURROUND-GATE SEMICONDUCTOR DEVICE ENCAPSULATED IN AN INSULATING MEDIUM

CROSS-REFERENCE TO RELATED APPLICATIONS

This application is based upon and claims priority from prior French Patent Application No. 02-04358, filed Apr. 8, 2002, the entire disclosure of which is herein incorporated by reference.

BACKGROUND OF THE INVENTION

1. Field of the Invention

The present invention relates to integrated circuits, and more specifically to surround-gate semiconductor devices in which the gate region coats the channel region.

2. Description of Related Art

Among "surround-gate" devices, we may distinguish devices with a double-gate in which the gate region has two parts, and those known as Gate All Around (GAA) in which the gate region is formed of a single part coating the channel region.

Surround-gate devices, whether with a double-gate or not, are particularly advantageous for channel lengths of less than 50 nanometers, since they make it possible to eliminate short channel effects while making it possible to obtain a doubled or tripled current strength relative to a conventional transistor. It may be recalled at this point that a short channel has a very short distance (length) between the source and the drain, and that the "short channel effect" is expressed by a reduction in the threshold voltage of the transistor, which may ultimately lead to obtaining a transistor which is very difficult to control and result in "drill" mode.

Different solutions are known for manufacturing double-gate semiconductor devices. A first solution consists of using a well known technique of molecular bonding to make on a semiconductor substrate a stack of layers including a first gate material layer topped by an insulating layer topped by a silicon layer topped by another insulating layer itself topped by a second gate material layer. This stack is anisotropically etched in order to define a pillar comprising the future bottom gate of the transistor insulated from the silicon layer (channel) by a dielectric layer, and the future top transistor gate supported by the channel and insulated from it by the other dielectric layer. The source and drain regions are then formed by a selective silicon epitaxy.

Such a solution has drawbacks. Among these is the fact that the source, channel, and drain regions are not formed with the same original silicon since the source and drain regions are the result of a further epitaxy. In fact such further epitaxy does not allow, given the surface prior cleaning problems, the form of the source and drain regions to be accurately controlled, which does not allow the value of the source and drain access resistances to be controlled very accurately.

Additionally, by virtue of this further epitaxy, the source and drain regions are bubble shaped, which requires that the necessary space be provided for these bubbles to form. Moreover, such a shape induces risks of leaks between the bottom gate and these source and drain regions.

Another solution consists in not totally etching the stack of layers initially formed on the substrate. More specifically, a first etching is made as far as the upper surface of the lower insulating layer of the stack. The sides of the pillar thus formed are then protected by insulating spacers. The remaining layers of the stack are then etched, and partial lateral etching is applied to the bottom layer of gate material, which is to form the future bottom gate of the transistor. A dielectric plug is then formed on the sides of this bottom gate, then the insulating spacers are eliminated and a selective further epitaxy is carried out, as in the preceding solution, so as to form the source and drain regions in contact with the channel region.

Such a solution allows better insulation of the source and drain regions relative to the bottom gate. However, it still has the drawback of requiring a further epitaxy, which is also carried out from the substrate. Therefore, apart from the already mentioned drawbacks of a further epitaxy on particularly the form of the source and drain regions, such a solution may lead to insulation problems between the channel region and the substrate.

Furthermore, this solution also has the major drawback of controlling the dimensions of the bottom gate and the top gate at two different times, and additionally in one case by anisotropic etching and in the other case by isotropic lateral etching. Generally, the source and drain regions are implanted relative to the top gate. Consequently, if the bottom gate has a dimension offset relative to the top gate (bottom: or top dimension), the result may be a deterioration in the performance of the transistor. Furthermore, such a solution does not lead to a device that can be perfectly reproduced in respect to gauging control dependency.

SUMMARY OF THE INVENTION

In view of these drawbacks, it is an object of the present invention to overcome these drawbacks and to provide a surround-gate semiconductor device of the GAA type or the double-gate type that offers no break in continuity in making the source, drain and channel regions.

Another object of the present invention is to provide a device having a self-alignment between the gate part located above the channel and the gate part located below the channel.

Yet another object of the present invention is to provide a device that is completely encapsulated in an insulating medium (e.g., a dielectric material) to allow it to be easily inserted into an integrated circuit with other components (the COC or "Cell on Chip" concept).

A further object of the present invention is to offer great flexibility in manufacturing the device, to enable bottom and top gates to be formed which may have different dimensions and different materials.

One embodiment of the present invention provides a semiconductor device that includes a semiconductor channel region extending above a semiconductor substrate in a longitudinal direction between a semiconductor source region and a semiconductor drain region, and a gate region extending in the transverse direction, coating the channel region, and insulated from the channel region. The source, channel, and drain regions are formed in a continuous semiconductor layer that is approximately plane and parallel to the upper surface of the substrate. Additionally, the source, drain, and gate regions are coated in an insulating coating so as to provide electrical insulation between the gate region and the source and drain regions, and between the substrate and the source, drain, gate, and channel regions. In a preferred embodiment, the thickness of the continuous semiconductor layer is about or between 10 and 30 nanometers.

Another embodiment of the present invention provides a method for manufacturing a semiconductor device that includes a semiconductor channel region extending above a semiconductor substrate in a longitudinal direction between a semiconductor source region and a semiconductor drain region, and a gate region extending in the transverse direction, coating the channel region, and insulated from the channel region. According to the method, a continuous semiconductor layer is formed so as to be approximately plane and parallel to the upper surface of the substrate, and the source, channel, and drain regions are formed within the continuous semiconductor layer. The source, drain and gate regions are coated in an insulating coating so as to provide an electrical insulation between the gate regions and the source and drain regions, and between the substrate and the source, drain, gate, and channel regions.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
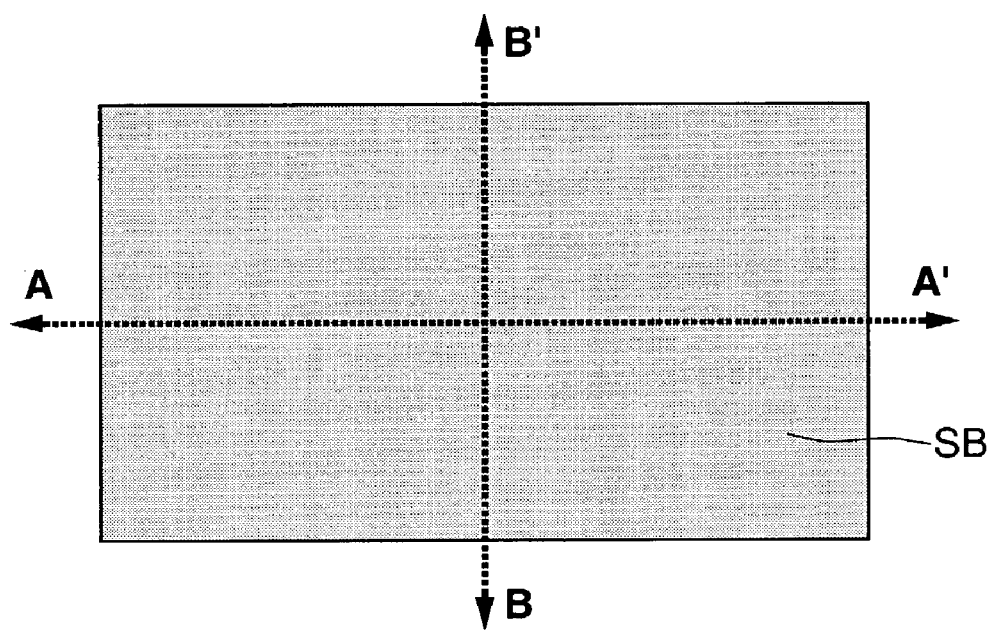
FIGS. 1 to 10b show the steps of a first embodiment of a process according to the present invention for producing an exemplary device according to the present invention.

Preferred embodiments of the present invention will be described in detail hereinbelow with reference to the attached drawings.

One preferred embodiment of the present invention provides a semiconductor device that includes a semiconductor channel region extending on a substrate in a longitudinal direction between a semiconductor source region and a semiconductor drain region, and a gate region extending in the transverse direction, coating the channel region and insulated from the channel region. The source, channel, and drain regions are formed of a continuous semiconductor upper layer approximately plane and parallel to the top surface of the substrate. Furthermore, the source, drain and gate regions are coated in an insulating coating so as to provide electrical insulation between the gate region and the source and drain regions as well as between the substrate and the source, drain, gate and channel regions. Preferably, the thickness of the continuous semiconductor layer is about a dozen nm (e.g., between 10 and 30 nm).

In some embodiments, the gate region is continuous so as to form a device of the GAA type. In other embodiments, the gate region is formed of an upper part and a lower part separated by a layer of dielectric material, so as to form a device of the double-gate type.

Further, in some embodiments, the dimensions of the gate part located under the channel region between the latter and the substrate is different from the gate part located above the channel region.

Preferably, the gate region is formed of the same material, such as doped polysilicon, metal, or a silicidated material of the $TiSi_2$, $CoSi_2$, to $XSi_{y(y=1.2)}$ type. Alternatively, the gate region may be formed of two different materials (for example, a metal material for the bottom part and polysilicon for the top part).

Another embodiment of the present invention provides an integrated circuit including such a semiconductor device.

Yet another embodiment of the present invention provides a process for manufacturing a semiconductor device. According to the process, a continuous semiconductor layer is formed approximately plane and parallel to the upper surface of the substrate, within which the source, channel, and drain regions are formed. The source, drain and gate regions are coated in an insulating coating so as to provide an electrical insulation between the gate regions and the source and drain regions, as well as between the substrate and the source, drain, gate and channel regions. Preferably, the formation of the gate region includes the formation of two self-aligned parts located respectively on each side of the channel region.

In one embodiment, the formation of the continuous semiconductor layer and the formation of the gate region includes the formation on the upper surface of the substrate of a stack formed of an insulating base layer and a silicon layer encapsulated between two encapsulation layers formed of a material which may be selectively eliminated relative to the silicon, for example a silicon-germanium alloy, anisotropic etching of the stack, a first partial selective isotropic etching of the two encapsulation layers, filling the partial tunnels resulting from the first isotropic etching with a dielectric material, another anisotropic etching, a second total selective etching of the residue of the encapsulation layers, oxidation of the silicon layer residue, and filling the empty spaces resulting from the second etching with at least one gate material.

As an alternative to obtain a device of the double-gate type, the formation of the gate region comprises a partial anisotropic etching of the gate material as far as the lower level of the oxidized silicon layer so as to form recesses on either side of a central pillar, formation of an insulating protection (spacers) on the sides of the pillar, oxidation of the upper surface of the non-etched gate material, and removing the insulating protection and filling the recesses with the gate material.

Exemplary embodiments of the present invention will now be described in detail with reference to FIGS. 1–12a. FIG. 1 shows a top view of a semiconductor wafer or semiconductor substrate SB that has a rectangular shape for the purposes of simplification. In the rest of the figures, figures numbered with the letter "a" correspond to a cross-section view along line AA' in FIG. 1, whereas figures numbered with the letter "b" correspond to a cross-section view along line BB' in FIG. 1.

Figure 2:
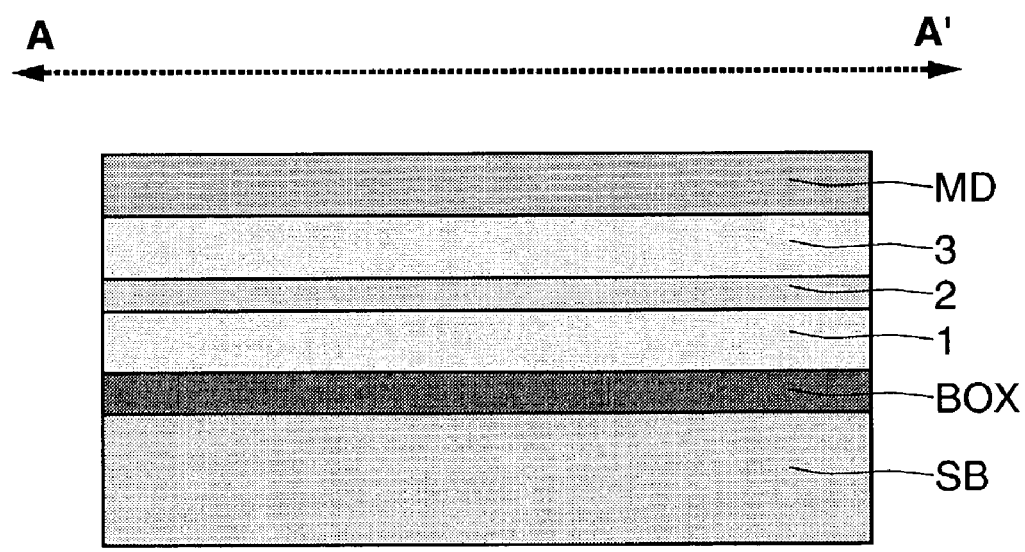

The first phase of the process consists, as shown in FIG. 2, of forming on the substrate SB an insulating base layer BOX surmounted by a stack formed of a silicon layer 2 encapsulated between two encapsulation layers 1 and 3, preferably formed of a silicon germanium alloy. The stack is itself topped by a silicon nitride layer MD made conventionally by deposition.

These stacked layers may be formed, for example, by the well known technique of molecular bonding. More precisely, the layer BOX is formed by thermal oxidation on a first substrate whereas the stack of layers 3, 2, and 1 is formed on the substrate SB by non-selective epitaxy for example. Then the upper surface of the layer 1 is made to bond, by molecular bonding, on the upper surface of the insulating base layer BOX. After removing the first substrate, the substrate SB is then obtained topped successively by the layers BOX, 1, 2, and 3. The hard mask layer MD is then formed conventionally by deposition on the layer 3 so as to form the structure shown in FIG. 2.

By way of illustration, the thickness of the insulating base layer BOX may be between 100 and 400 nanometers, whereas the thickness of the two encapsulation layers may be between 30 and 70 nanometers, and the thickness of the silicon layer 2 within which (as will be seen in more detail hereinafter) the source, channel, and drain regions will be made, may be between 10 and 30 nanometers.

Figure 3A:
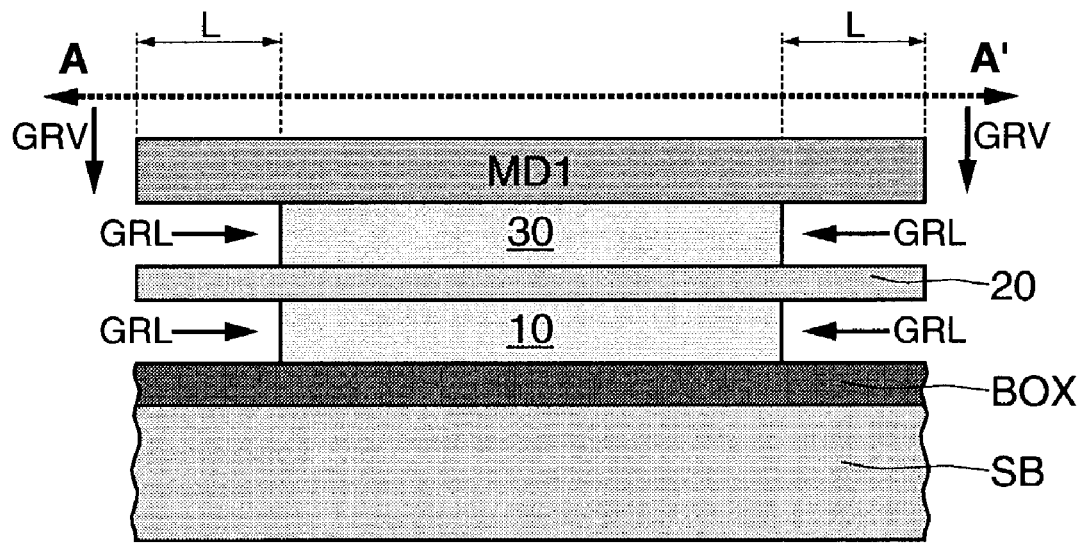
Figure 3B:
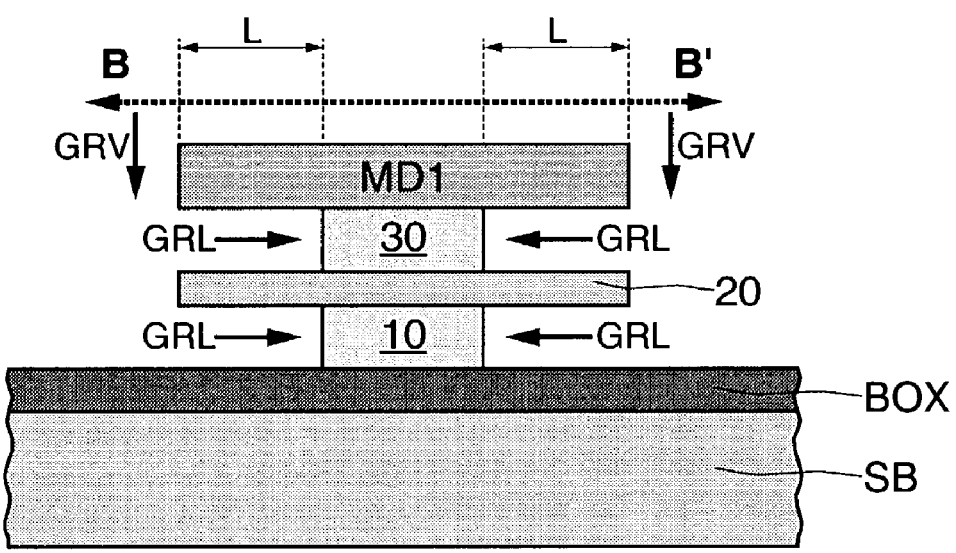

Then, as shown in the FIGS. 3a and 3b, after forming, by a conventional photolithography step, a block of resin on the silicon nitride layer MD1, vertical etching GRV is performed so as to stop on the insulating base layer BOX. This etching, selective relative to the thermal oxide of the base layer BOX, may be a plasma etching for example. This is followed by a partial selective lateral isotropic etching GRL of the two encapsulation layers 1 and 3 over a length L which is identical for both encapsulation layers in this example. The characteristics of such lateral etching are well known and have been the subject of a number of publications, such as French patent application no. 2 791 178. More specifically, use may be made of a well known oxidizing chemistry such as a 40 ml solution of 70% $HNO_3$+20 ml $H_2O_2$ +5 ml 0.5% HF, or else isotropic plasma etching.

It should be noted that, although any material that can be selectively eliminated relative to the silicon is suitable, $Si_{1-x}Ge_x$ alloys are recommended since they can be easily eliminated selectively by such oxidizing chemistry or by isotropic plasma etching. These alloys make it easy to obtain a fine silicon layer 2 by epitaxy. It should also be noted that the percentage of germanium in the encapsulation layers has a direct influence over the etching speed. Also, it will be easy to obtain different etching lengths for the upper encapsulation layer 3 and the lower encapsulation layer 1 by adopting different germanium percentages in the two alloys composing these encapsulation layers. In this way, the dimensions of the etched encapsulation layer 10 and that of the etched encapsulation layer 30 may be different. In fact it will be seen in more detail hereinafter that these two etched encapsulation layers will be eliminated then replaced by a gate material in such a way as to form the final top and bottom gates of the device. Consequently, it is thus possible to obtain in the end a semiconductor device having identical or indeed different top and bottom gate parts.

Figure 4A:
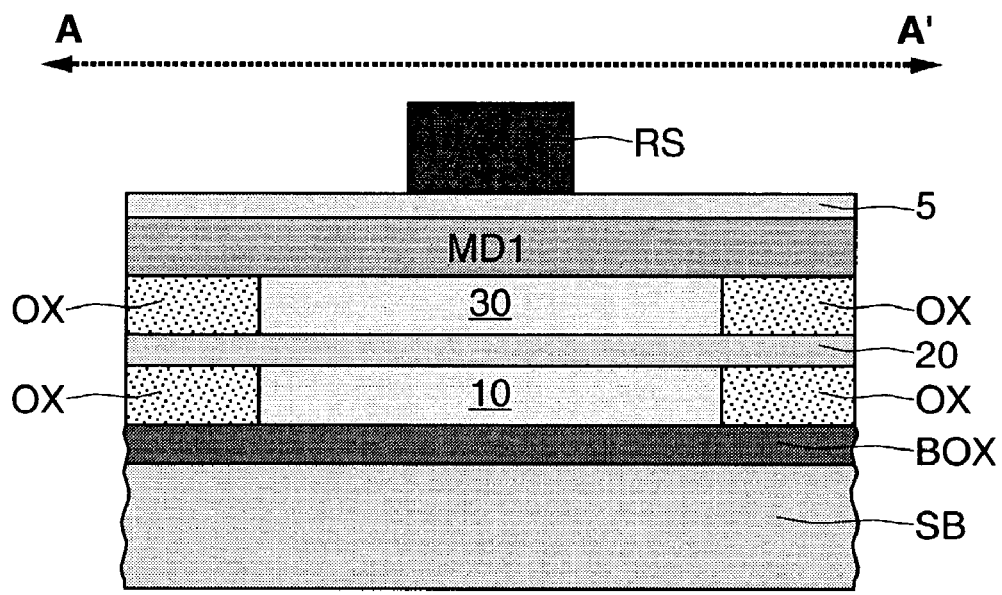
Figure 4B:
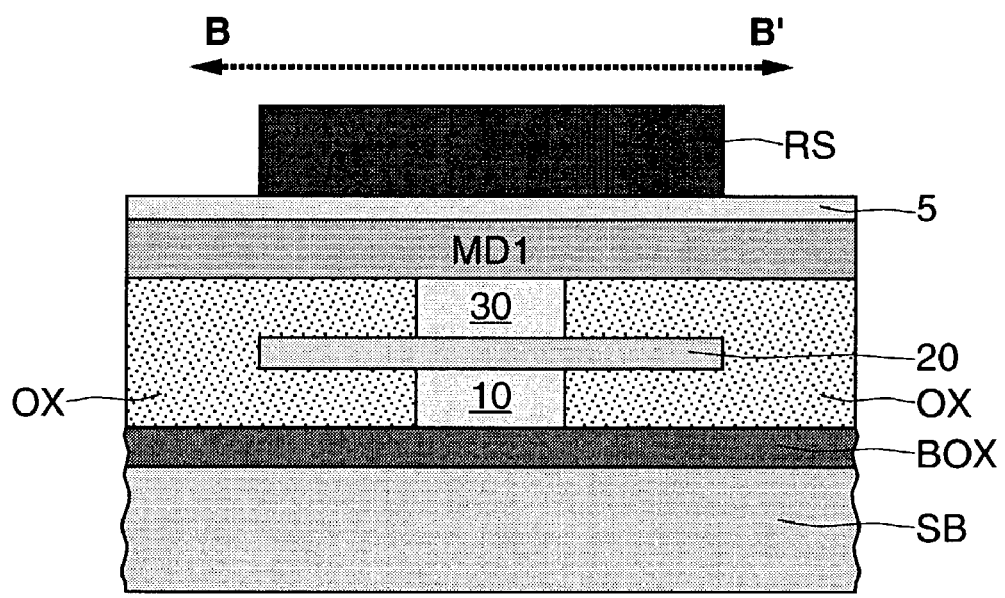

The next step, shown in FIGS. 4a and 4b, consists of filling the partial tunnels resulting from the partial selective isotropic etching of the encapsulation layers with a dielectric material OX so as to provide total insulation of the sides. This insulating dielectric material OX may be obtained for example by high temperature deposition of an oxide film TEOS. As an alternative, the material used may be BSG (Bore Silicone Glass) which has better etching selectivity relative to the oxide of the base layer BOX, than that of an oxide TEOS.

Mechanochemical polishing is then performed stopping on the layer MD1. Then, after depositing a dielectric film 5, of $SiO_2$ for example, on the silicon nitride layer MD1, a block of resin RS is formed on the layer 5 using a conventional photolithographic step. The geometry of the block RS corresponds to the geometry of the future active zone of the semiconductor device.

Figure 5A:
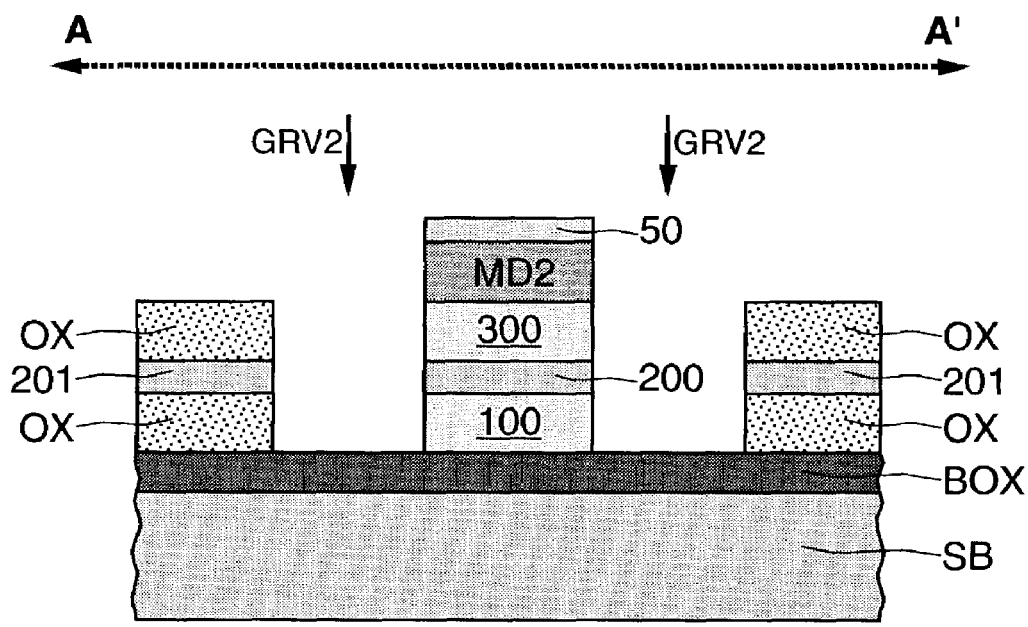
Figure 5B:
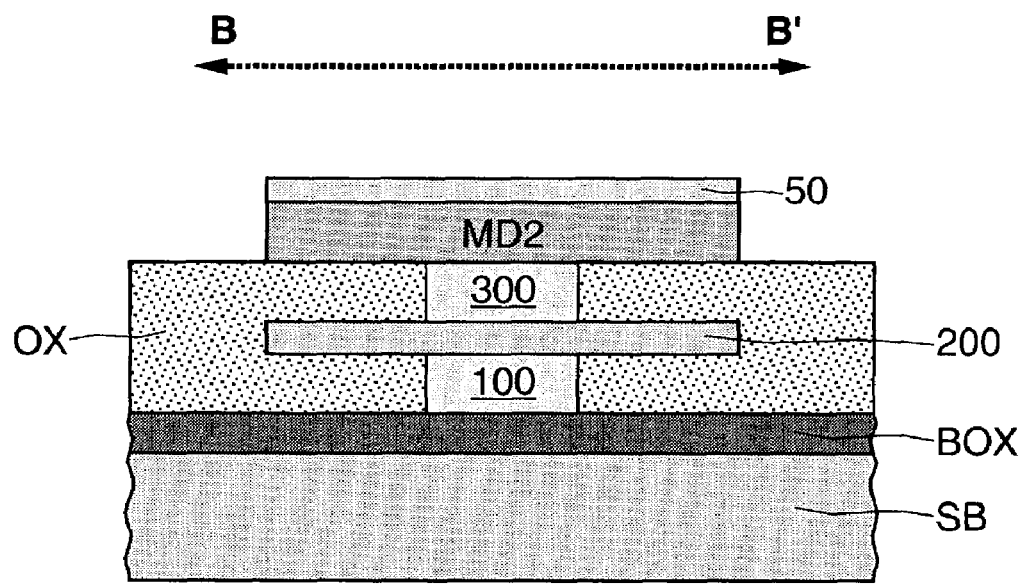

The next step, as shown in FIGS. 5a and 5b, is an etching GRV2 that includes first etching, selectively relative to the oxide OX, the layer 5 and the hard mask layer MD1. At the end of this first etching there remains a silicon nitride layer residue MD2 surmounted by a dielectric layer residue 50. The etching GRV2 is then continued by selective anisotropic etching relative to the oxide OX of the silicon layer 20 and the encapsulation layers 10 and 30, and this on either side of the nitride mask MD2.

The structure shown in FIGS. 5a and 5b is then obtained with a continuous semiconductor layer 200 approximately parallel to the substrate SB and in which the source, channel, and drain regions will be made, and with regions 100 and 300 denoting respectively the residue of the encapsulation layers which will be eliminated and then replaced by the gate material.

Figure 6A:
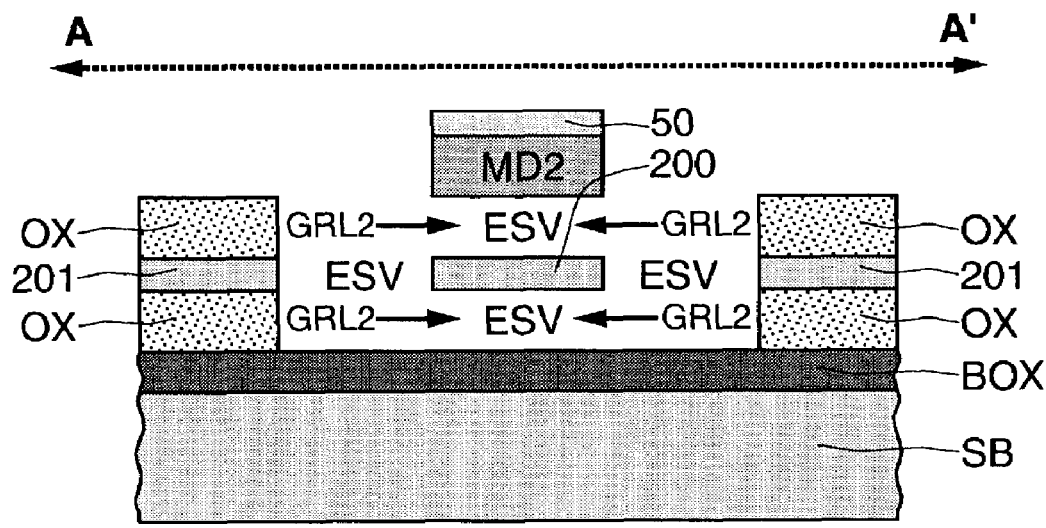
Figure 6B:
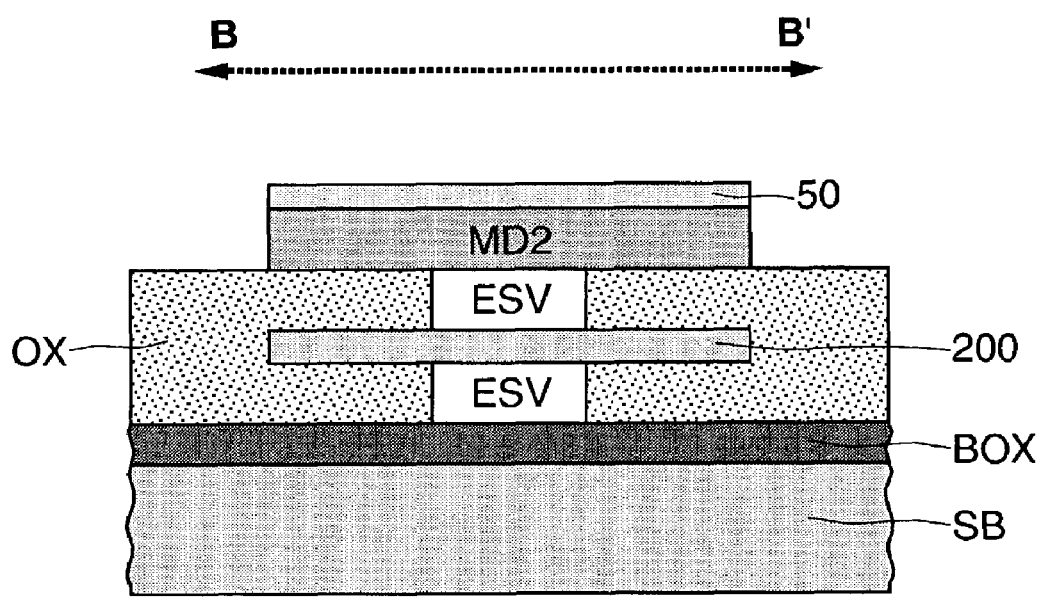

In this respect, the next step consists, as shown in FIGS. 6a and 6b, of performing a total selective isotropic etching GRL2 of the residue of the encapsulation layers, the selectivity being relative to the silicon of the layer 200. The characteristics of the total selective isotropic etching GRL2 are preferably identical to those of the etching GRL (FIGS. 3a and 3b). Empty spaces ESV are then created, as shown in FIGS. 6a and 6b, around the channel layer 200 which forms a bridge between the oxide regions OX.

Figure 7A:
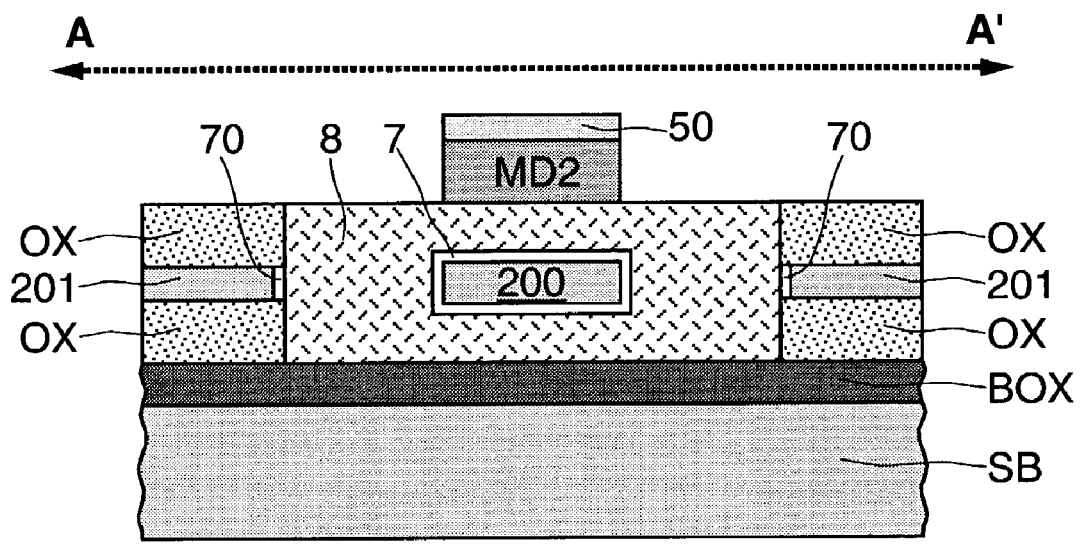
Figure 7B:
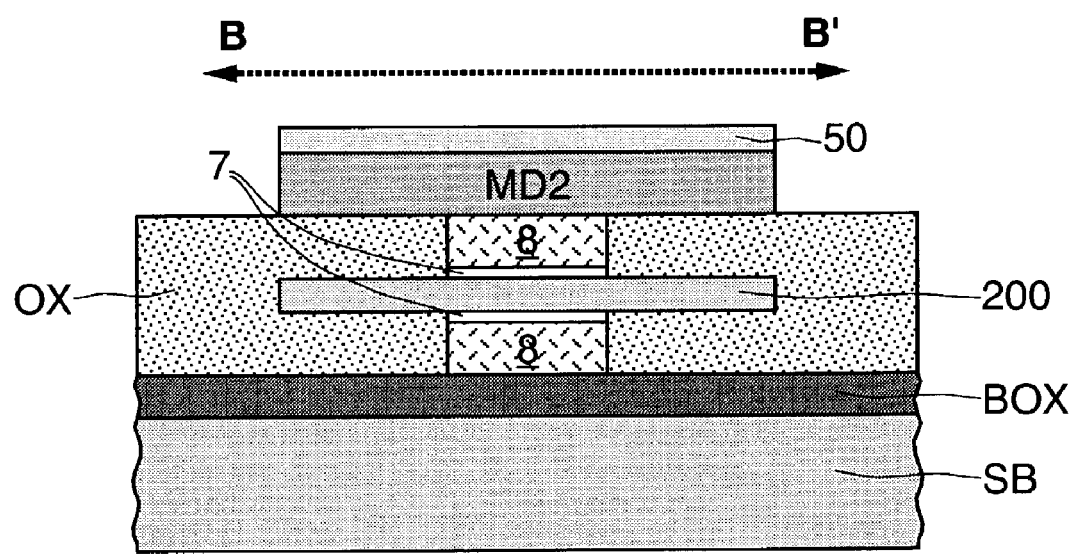
Figure 8A:
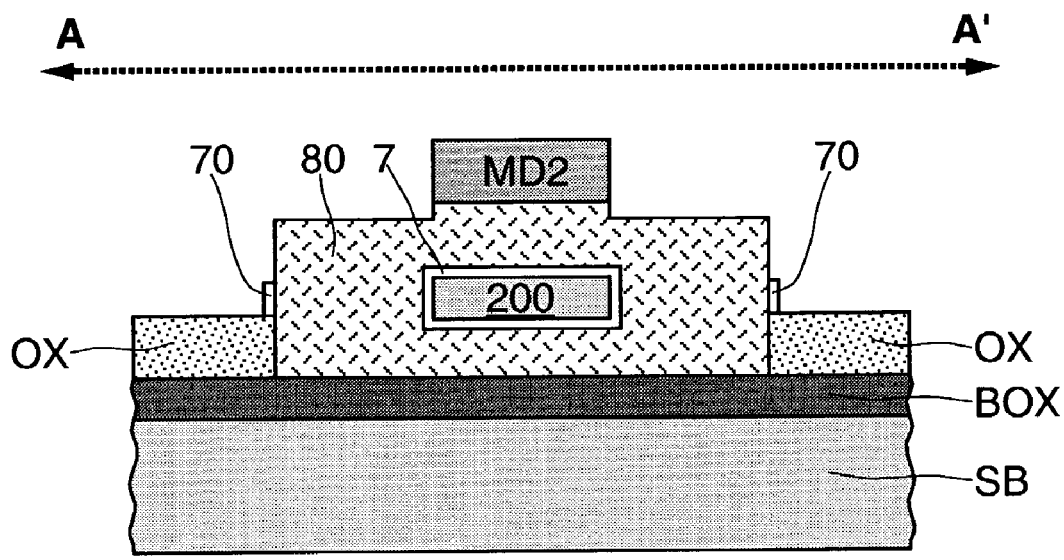
Figure 8B:
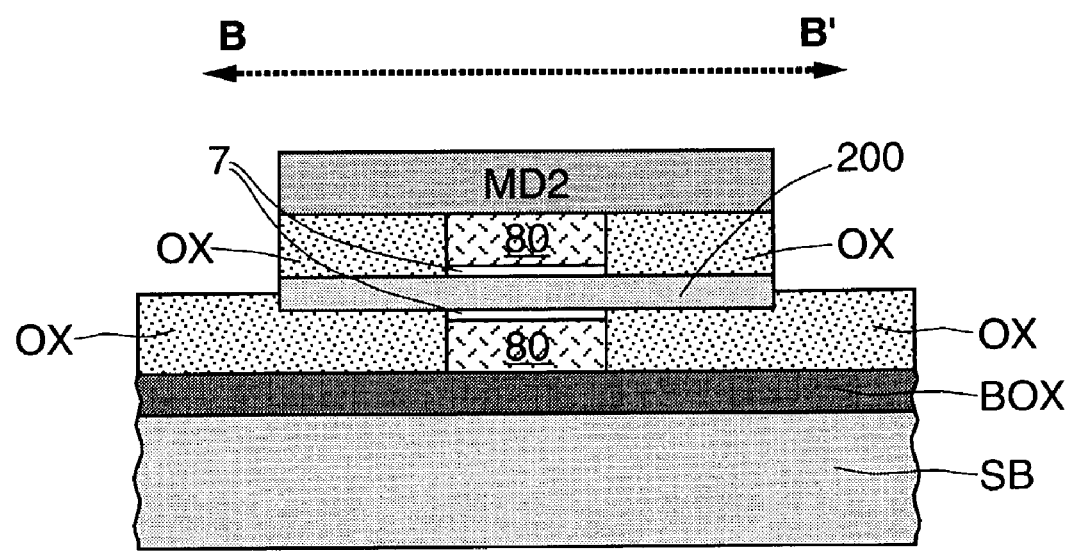
Figure 9A:
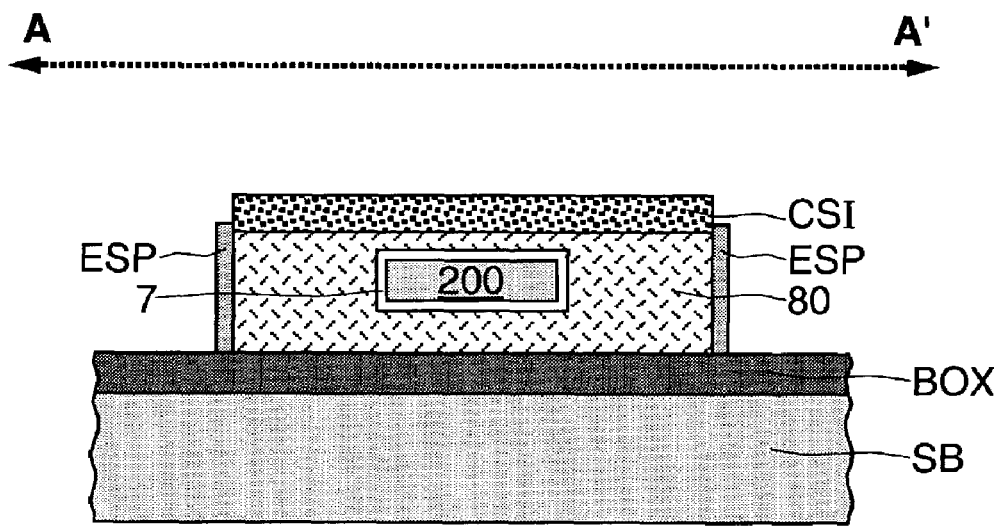
Figure 9B:
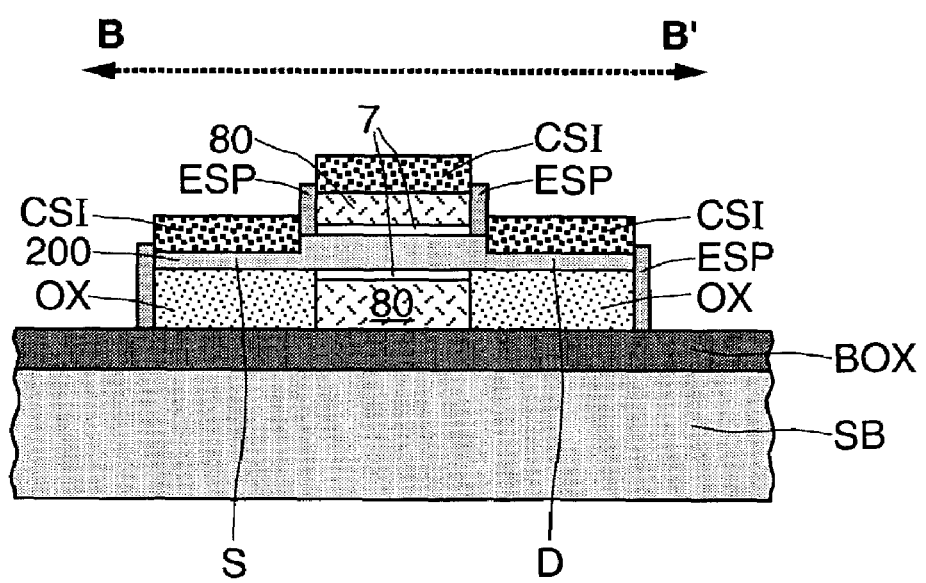

Then, as shown in FIGS. 7a and 7b, a thermal oxidation is performed so as to deposit on the walls of the channel layer 200 a fine layer 7 of silicon oxide. Likewise, by this thermal oxidation, oxide 70 is also deposited on the parts 201 of the silicon layer. The empty spaces ESV resulting from the total selective isotropic etching GRL2 are then filled with a gate material 8. This material may be polysilicon formed by a CVD deposition or else a metal material, such as titanium or tungsten, which may also be deposited by CVD or ALCVD depositions. Mechanochemical polishing is then performed followed by an additional etching that stops on the oxide layer OX so as to obtain the structure shown in FIGS. 7a and 7b.

The next step consists (FIGS. 8a and 8b) of etching, on either side of the hard mask MD2, the oxide OX then in etching the silicon of the layers 201.

The next step (FIGS. 9a and 9b) is to etch the hard mask MD2, then the oxide OX. Insulating spacers ESP, of silicon nitride for example, are then formed in a conventional way on the sides of the gate region 80 and on the sides of the continuous semiconductor layer 200.

The next step is to implant the silicon layer 200 on either side of the upper part of the gate, so as to form the source and drain regions S and D. The next step is then a conventional step of silicidation on the source and drain regions as well as on the upper surface of the upper part of the gate 80. This leads to the formation of zones CSI formed of a metal silicide, in this case for example cobalt silicide.

Figure 10A:
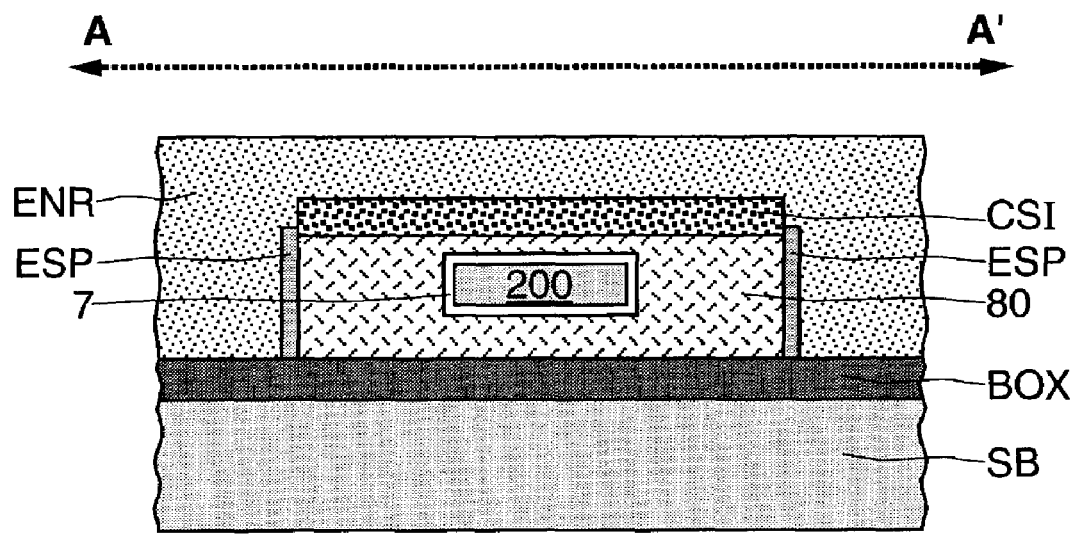
Figure 10B:
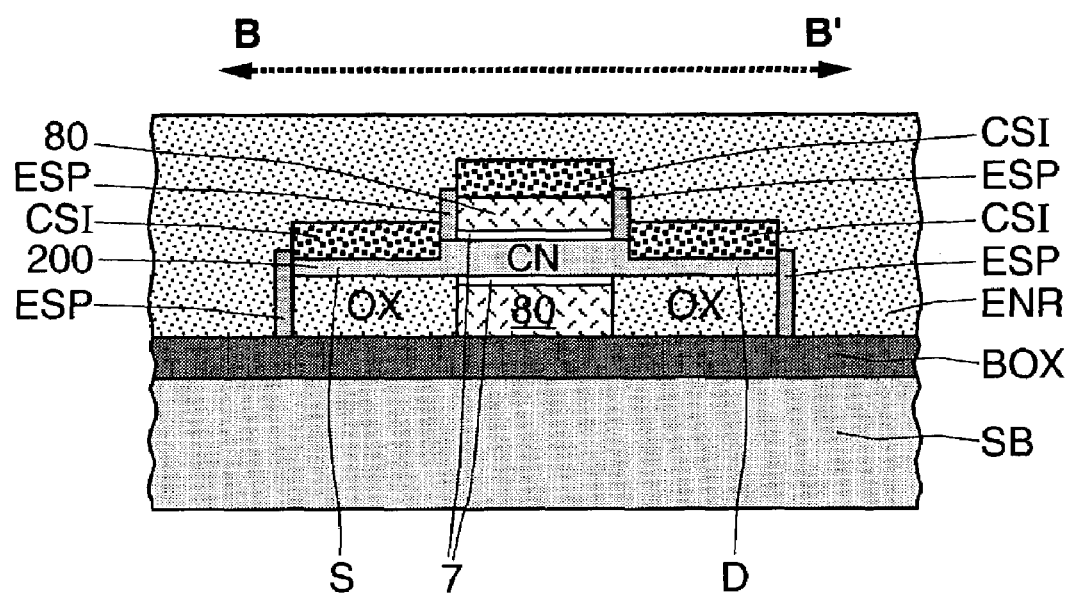

Then, as shown in FIGS. 10a and 10b, the next step is to coat the device using an insulating material ENR, for example the oxide TEOS.

The device thus obtained includes, in the embodiment shown in FIGS. 10a and 10b, a source region S, a channel region CN and a drain region D formed in the continuous semiconductor layer 200 approximately plane and parallel to the upper surface of the substrate SB. Furthermore, the source, channel, and drain regions are totally insulated from the substrate on the one hand, and from the gate region on the other hand, by an insulating coating including an oxidizing layer OX residue, the spacers ESP, the coating ENR and the base layer BOX. The source, channel, and drain layers are also totally insulated from the gate region. And, the bottom gate region is itself insulated from the substrate by the insulating base layer BOX.

The top gate part and the bottom gate part are self-aligned. The final step in making the component consists of conventional hardware handshaking in the silicidation zones CSI. It should be noted at this point that such a component may easily be incorporated within an integrated circuit placed on another wafer for example (COC or "cell on chip" design).

The embodiment just described corresponds to a transistor with the gate surrounding the channel region continuously. A description will now be given with reference to FIGS. 11a and 12a of an alternative embodiment that allows the formation of a double-gate device.

Figure 11A:
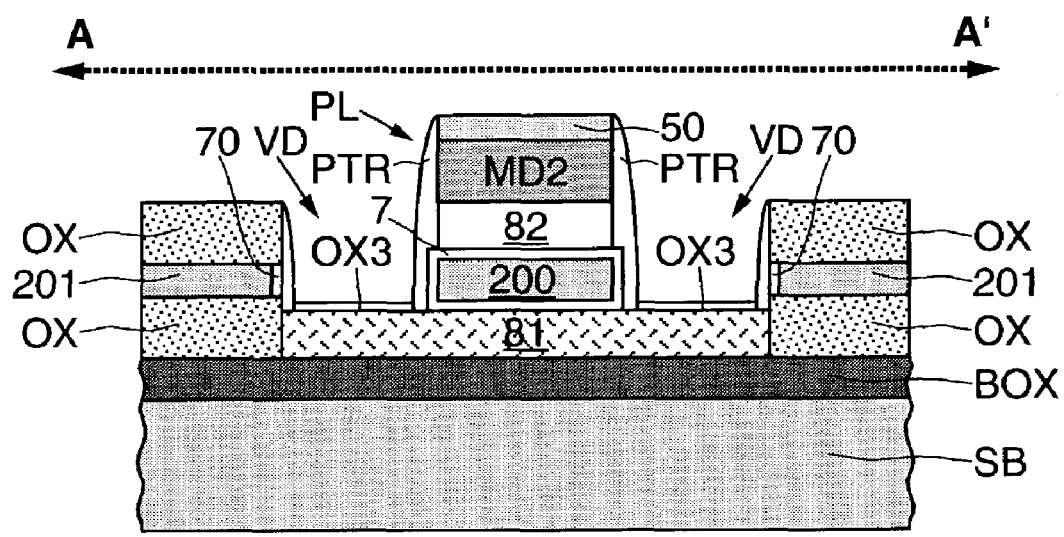
FIGS. 11a and 12a show a relevant portion of another embodiment of the present invention.
Figure 12A:
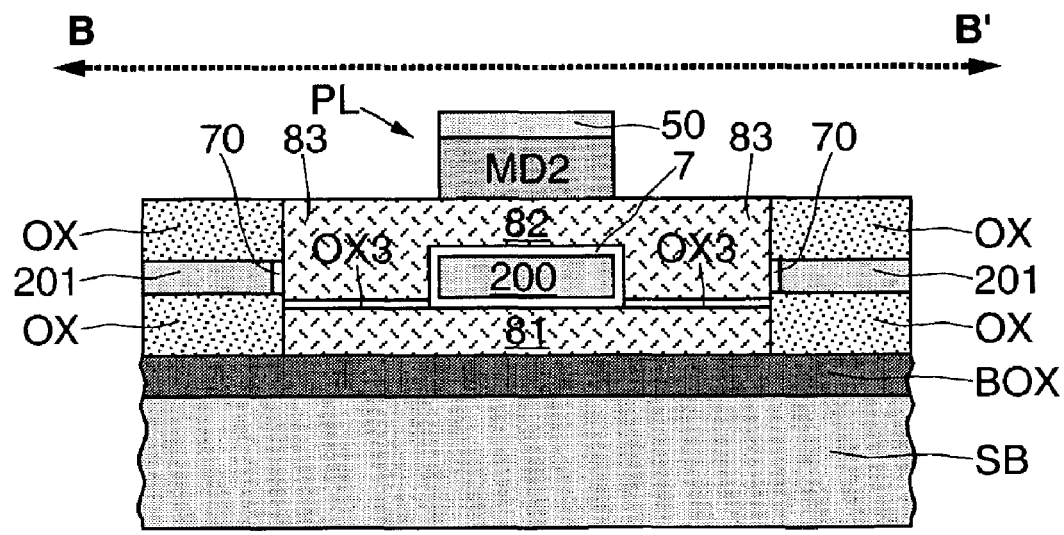

In this respect, from the structure shown in FIG. 7a, there is a step, as shown in FIG. 11a, of partial anisotropic etching of the gate material 80 as far as the lower level of the oxidized silicon layer 200, so as to form recesses VD on either side of a central pillar PL. Then, in a conventional manner, insulating spacers PTR are formed on the sides of the central pillar in particular. The next step is then a thermal oxidation of the upper surface of the non-etched gate material 81 so as to form an oxide layer OX3, having for example a thickness of about 10 to 15 nm.

The next step is to remove the insulating protections PTR and to fill the recesses VD with gate material 83 which in combination with the gate material 82 which was located between the layer 200 and the hard mask MD2 will form the upper part of the gate.

It will be noted at this point that the upper part of the gate 82 and 83 is separated from the lower part of the gate 81 by the oxide layer OX3 as well as by the oxide layer 7. A double-gate device is thus in fact obtained.

The rest of the process is carried out in a similar way to what has been described above with reference to FIGS. 8a–10b.

It should also be noted that two different materials could be used for the lower part of the gate and the upper part of the gate.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor device comprising:
    a semiconductor source region;
    a semiconductor drain region;
    a semiconductor channel extending above a semiconductor substrate in a longitudinal direction between the semiconductor source region and the semiconductor drain region; and
    a gate region extending in the transverse direction to the channel region, the gate region coating the channel region and insulated from the channel region,
    wherein the source, channel and drain regions are formed in a continuous semiconductor layer that is approximately plane and parallel to the upper surface of the substrate,
    the source, drain, and gate region are completely encapsulated in an insulating coating so as to provide electrical insulation between the gate region and the source and drain regions, and between the substrate and the source, drain, gate, and channel regions,
    the gate region is continuous, and
    the gate region is formed of two different materials.

2. The device according to claim 1, wherein the thickness of the continuous semiconductor layer is about or between 10 and 30 nanometers.

3. The device according to claim 1, wherein dimensions of a part of the gate region located under the channel region are different from dimensions of a part of the gate region located above the channel region.

4. An integrated circuit including at least one semiconductor device, said semiconductor device comprising:
    a semiconductor source region;
    a semiconductor drain region;
    a semiconductor channel region extending above a semiconductor substrate in a longitudinal direction between the semiconductor source region and the semiconductor drain region; and
    a gate region extending in the transverse direction to the channel region, the gate region coating the channel region and insulated from the channel region,
    wherein the source, channel, and drain regions are formed in a continuous semiconductor layer that is approximately plane and parallel to the upper surface of the substrate,
    the source, drain, and gate regions are completely encapsulated in an insulating coating so as to provide electrical insulation between the gate region and the source and drain regions, and between the substrate and the source, drain, gate, and channel regions,
    the gate region is continuous, and
    the gate region is formed of two different materials.

5. The integrated circuit according to claim 4, wherein the thickness of the continuous semiconductor layer is about or between 10 and 30 nanometers.

* * * * *